(12) United States Patent
Subrahmanyam et al.

(10) Patent No.: US 7,006,331 B1
(45) Date of Patent: Feb. 28, 2006

(54) HEAD GIMBAL ASSEMBLY INCLUDING A TRACE SUSPENSION ASSEMBLY BACKING LAYER WITH A CONDUCTIVE LAYER FORMED UPON A GIMBAL HAVING A LOWER OXIDATION RATE

(75) Inventors: Jai N. Subrahmanyam, San Diego, CA (US); Pierre C. Humbert, San Jose, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 245 days.

(21) Appl. No.: 10/676,538

(22) Filed: Sep. 30, 2003

(51) Int. Cl.
*G11B 5/60* (2006.01)

(52) U.S. Cl. ............... 360/245.9; 360/245.4; 360/234.6

(58) Field of Classification Search ............. 360/245.9, 360/234.6, 245.4, 234.5, 245.3, 245
See application file for complete search history.

(56) References Cited

U.S. PATENT DOCUMENTS

| | | | | |
|---|---|---|---|---|
| 5,812,344 A | * | 9/1998 | Balakrishnan | 360/245.9 |
| 6,125,015 A | * | 9/2000 | Carlson et al. | 360/245.9 |
| 6,146,813 A | * | 11/2000 | Girard et al. | 430/319 |
| 6,313,972 B1 | * | 11/2001 | Williams et al. | 360/245.3 |
| 6,480,359 B1 | * | 11/2002 | Dunn et al. | 360/245.9 |
| 6,846,991 B1 | * | 1/2005 | Girard et al. | 174/250 |
| 6,872,896 B1 | * | 3/2005 | Young et al. | 200/16 A |
| 6,950,288 B1 | * | 9/2005 | Yao et al. | 360/294.4 |

* cited by examiner

*Primary Examiner*—Robert S. Tupper
(74) *Attorney, Agent, or Firm*—Stetina, Brunda, Garred & Brucker; Joshua C. Harrison, Esq.

(57) ABSTRACT

A head gimbal assembly for a disk drive. The head gimbal assembly includes a trace suspension assembly backing layer including a gimbal. The trace suspension assembly backing layer is formed of a conductive material having a first oxidation rate. The head gimbal assembly further includes a gimbal conductive layer disposed upon the gimbal and formed of a conductive material having a second oxidation rate lower than the first oxidation rate. The head gimbal assembly further includes a slider supported by the gimbal. The head gimbal assembly further includes a conductive compound disposed between the gimbal conductive layer and the slider for electrically grounding the slider to the trace suspension assembly backing layer.

21 Claims, 9 Drawing Sheets

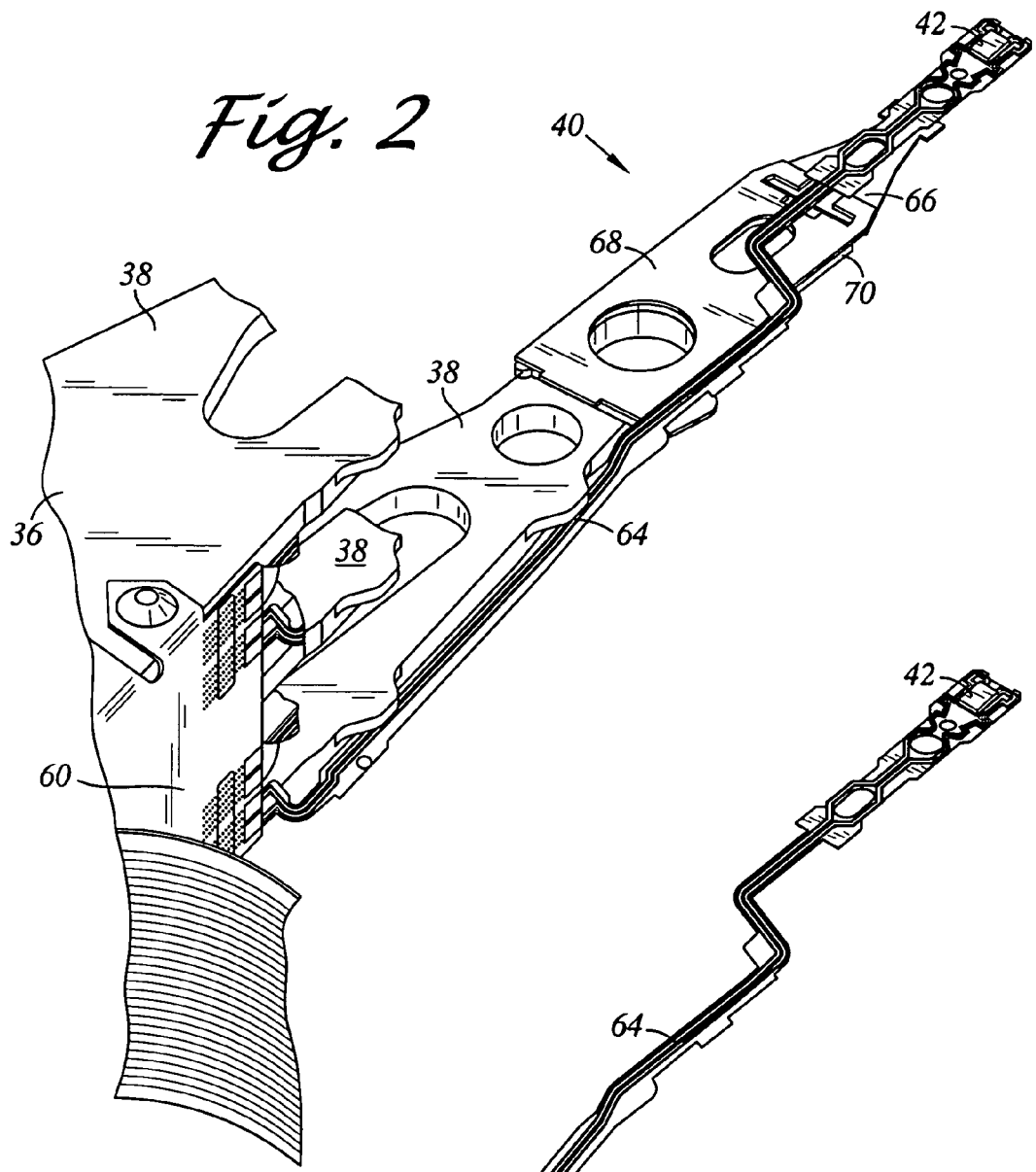
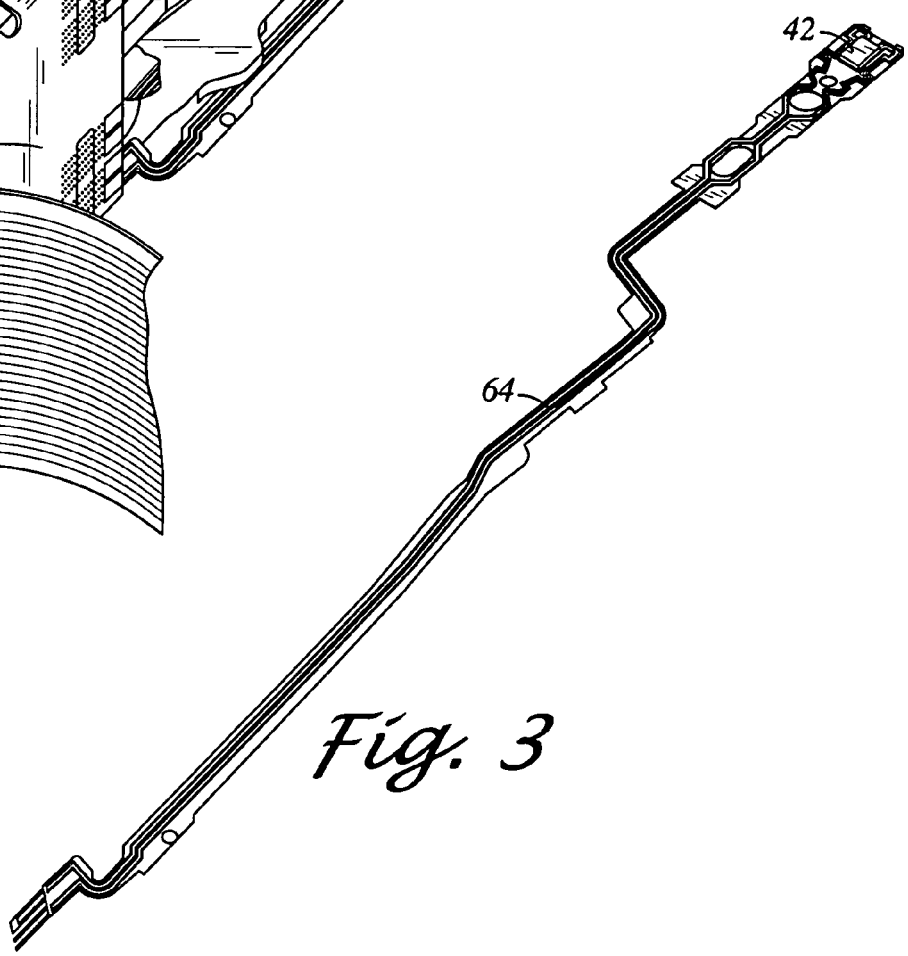

HEAD GIMBAL ASSEMBLY INCLUDING A TRACE SUSPENSION ASSEMBLY BACKING LAYER WITH A CONDUCTIVE LAYER FORMED UPON A GIMBAL HAVING A LOWER OXIDATION RATE

BACKGROUND OF THE INVENTION

1. Field of the Invention

The present invention relates generally to disk drives, and in particular to a disk drive including head gimbal assembly including a trace suspension assembly backing layer with a conductive layer formed upon a gimbal having a lower oxidation rate.

2. Description of the Prior Art

The typical hard disk drive includes a head disk assembly (HDA) and a printed circuit board assembly (PCBA) attached to a disk drive base of the HDA. The head disk assembly includes at least one magnetic disk, a spindle motor for rotating the disk, and a head stack assembly (HSA). The spindle motor includes a spindle motor hub that is rotatably attached to the disk drive base. The hub has an outer hub flange that supports a lowermost one of the disks. Additional disks may be stacked and separated with annular disk spacers that are disposed about the hub. The head stack assembly has an actuator assembly having at least one transducer head, typically several, for reading and writing data from and to the disk. The printed circuit board assembly includes a servo control system in the form of a disk controller for generating servo control signals. The head stack assembly is controllably positioned in response to the generated servo control signals from the disk controller. In so doing, the attached heads are moved relative to tracks disposed upon the disk.

The head stack assembly includes an actuator assembly, at least one head gimbal assembly, and a flex circuit cable assembly. A conventional "rotary" or "swing-type" actuator assembly typically includes an actuator having an actuator body. The actuator body is configured to rotate on a pivot assembly between limited positions about an axis of rotation. A coil support extends from one side of the actuator body. A coil is supported by the coil support and is configured to interact with one or more permanent magnets to form a voice coil motor. One or more actuator arms extend from an opposite side of the actuator body.

A head gimbal assembly includes a transducer head, typically a magneto-resistive ("MR") head, which is distally attached to each of the actuator arms. To facilitate rotational movement of the actuator, the actuator assembly further includes the actuator body that has a bore and a pivot bearing cartridge engaged within the bore. Each magnetic disk includes opposing disk surfaces. Data may be recorded on a single surface or both along data annular regions. As such, the head stack assembly may be pivoted such that each transducer head is disposed adjacent the various data annular regions from adjacent the outer diameter to the inner diameter of each disk.

The head gimbal assembly includes a slider. The transducer head is disposed within the slider. A head gimbal assembly without an attached slider is referred to as a suspension assembly. In this regard the suspension assembly acts to suspend or support the slider. The head gimbal assembly may further include a trace suspension assembly, a load beam (also referred to as a "suspension"), nut plate (also referred to as a "swage plate"), and a hinge plate.

The trace suspension assembly typically includes a trace suspension assembly backing layer typically formed of a conductive material such as stainless steel. Conductive traces (formed of copper for example) are laid on a dielectric layer (such as a polyimide) formed on the trace suspension assembly backing layer. The dielectric layer electrically insulates the conductive traces from the trace suspension assembly backing layer. Such technologies are variously named TSA (Trace Suspension Assembly), NSL (No Service Loop), FOS (Flex On Suspension) and the like. These conductive traces interconnect the elements of the transducer head to the drive preamp and the circuits associated therewith. There are typically four conductive traces for the write and read differential pairs of the transducer head. The conductive traces are electrically connected to the transducer head at a trailing end of the slider. Such conductive traces are typically formed upon the dielectric layer through a deposition and/or etching process. The conductive traces include terminal pads which are disposed adjacent the slider. Various electrical connection techniques may be used to connect the terminal pads to the slider, such as gold ball bonding or wire bonding.

Trace suspension assembly backing layer includes a gimbal which overlaps with the load beam. The load beam is configured to transmit a gram load biasing force to the gimbal to "load" the slider against the disk. The hinge plate joins the load beam to the nut plate to permit the slider to follow the surface contour of the spinning disk. The spinning disk develops a laminar airflow above its surface that lifts the slider away from the disk in opposition to the gram load biasing force. The slider is said to be "flying" over the disk when in this state. The nut plate is used to attach the head gimbal assembly to a tip of the actuator arm via a swaging operation.

As disk drives have progressed to higher areal densities, the fly height has been correspondingly reduced. The reduction in fly height has made head (slider)-to-disk interactions more likely. In particular, such close proximity of the slider to the disk may result in undesirable electrical discharge between the slider and the disk. In this regard, while the slider may be attached to the gimbal using structural epoxy, a conductive material such as conductive epoxy (such as silver epoxy) may be applied for electrical and thermal conductivity. The conductive epoxy provides a conductive path to electrical ground from the slider to the gimbal which in turn is electrically connected to the load beam, the actuator arm, and eventually the disk drive base. The application of voltage between the slider and the gimbal in excess of the "breakdown voltage" may be used in order to establish a controlled impedance path through the conductive epoxy. In practice, however, it has been found that despite the utilization of the conductive epoxy, undesirable electrical discharge events between the slider and the disk may nonetheless occur.

Accordingly, there is a need in the art for a disk drive having an improved head gimbal assembly design in comparison to the prior art.

SUMMARY OF THE INVENTION

According to an aspect of the present invention, there is provided a head gimbal assembly for a disk drive. The head gimbal assembly includes a trace suspension assembly backing layer including a gimbal. The trace suspension assembly backing layer is formed of a conductive material having a first oxidation rate. The head gimbal assembly further includes a gimbal conductive layer disposed upon the gimbal and formed of a conductive material having a second oxidation rate lower than the first oxidation rate. The head gimbal assembly further includes a slider supported by the gimbal. The head gimbal assembly further includes a conductive compound disposed between the gimbal conductive layer and the slider for electrically grounding the slider to the trace suspension assembly backing layer.

According to various embodiments, the trace suspension assembly backing layer may be formed of stainless steel. The gimbal conductive layer may be formed of gold or platinum. The slider defines a slider perimeter and the gimbal conductive layer defines a gimbal conductive layer perimeter less than an area of the slider perimeter. The gimbal defines a gimbal perimeter and the gimbal conductive layer may define a gimbal conductive layer perimeter less than an area of the gimbal perimeter. The conductive compound may be a conductive epoxy. The head gimbal assembly may further include an adhesive compound disposed between the trace suspension assembly and the slider for attaching the slider to the trace suspension assembly backing layer. The adhesive compound may be disposed between the gimbal conductive layer and the slider. The adhesive compound may be a structural epoxy.

According to another aspect of the present invention, there is provided a head stack assembly for use with a disk drive. The head stack assembly includes a flex cable assembly, an actuator including an actuator arm, and a load beam coupled to the actuator arm. The load beam is formed of an electrically conductive material. The head stack assembly further includes a trace suspension assembly backing layer coupled to the load beam and including a gimbal. The trace suspension assembly backing layer is formed of a conductive material having a first oxidation rate. The head stack assembly further includes a gimbal conductive layer disposed upon the gimbal and formed of a conductive material having a second oxidation rate lower than the first oxidation rate. The head stack assembly further includes a slider supported by the gimbal. The head stack assembly further includes a conductive compound disposed between the gimbal conductive layer and the slider for electrically grounding the slider to the trace suspension assembly backing layer.

According to another aspect of the present invention, there is provided a disk drive. The disk drive includes a disk drive base and a head stack assembly rotatably coupled to the disk drive base. The head stack assembly is as described above.

According to yet another aspect of the present invention, there is provided a method of manufacturing a head gimbal assembly for a disk drive. The method includes providing a trace suspension assembly backing layer including a gimbal. The trace suspension assembly backing layer is formed of a conductive material having a first oxidation rate. A gimbal conductive layer is formed upon the gimbal. The gimbal conductive layer is formed of a conductive material having a second oxidation rate lower than the first oxidation rate. A slider is attached to the gimbal with a conductive compound disposed between the slider and the gimbal conductive layer for grounding the slider to the trace suspension assembly backing layer.

According to various embodiments, the gimbal includes an oxidation layer and the method further includes removing the oxidation layer. The gimbal conductive layer may be formed upon the gimbal via a plating process. The conductive compound may be a conductive epoxy. The slider may be attached to the gimbal with an adhesive compound disposed between the slider and the trace suspension assembly backing layer for attaching the slider to the trace suspension backing layer.

BRIEF DESCRIPTION OF THE DRAWINGS

FIG. 2 is an enlarged perspective view of a portion of a head stack assembly of the disk drive of FIG. 1 including a head gimbal assembly;

FIG. 3 is a perspective view of a trace suspension assembly of the head gimbal assembly of FIG. 2 as shown with a slider;

DESCRIPTION OF THE PREFERRED EMBODIMENTS

Figure 1:
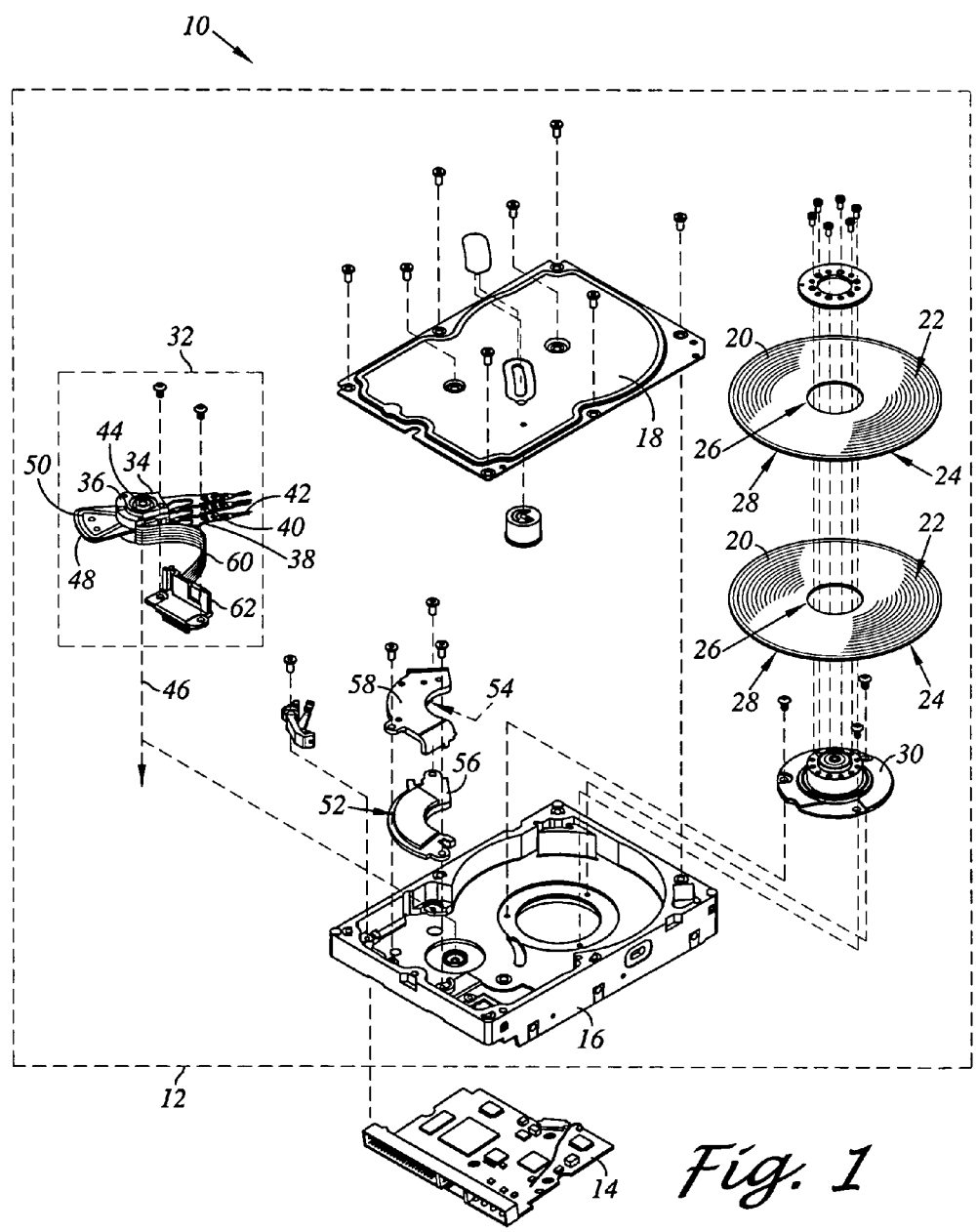
FIG. 1 is an exploded perspective view of a disk drive in accordance with an aspect of the present invention.

Referring now to the drawings wherein the showings are for purposes of illustrating preferred embodiments of the present invention only, and not for purposes of limiting the same, FIGS. 1–15 illustrate a disk drive including a head gimbal assembly and method of manufacturing the head gimbal assembly in accordance with aspects of the present invention.

Referring now to FIG. 1, there is depicted an exploded perspective view of a disk drive 10 as constructed in accordance with an aspect of the present invention. The disk drive 10 includes a head disk assembly (HDA) 12 and a printed circuit board assembly (PCBA) 14. The head disk assembly 12 includes a disk drive housing having disk drive housing members, such as a disk drive base 16 and a cover 18. The disk drive base 16 and the cover 18 collectively house at least one magnetic disk 20. While two disks 20 are shown, a single disk of multiple disks may be provided. Each disk 20 contains a plurality of tracks for storing data. The tracks are disposed upon opposing first and second disk surfaces 22, 24 of the disk 20 that extend between an inner disk edge 26 (associated with the inner diameter) and an outer disk edge 28 (associated with the outer diameter) of the disk 20. The head disk assembly 12 further includes a spindle motor 30 for rotating the disk 20. The head disk assembly 12 further includes a head stack assembly 32 rotatably attached to the disk drive base 16 in operable communication with the disks 20. The head stack assembly 32 includes a rotary actuator 34.

The actuator 34 includes an actuator body 36 and actuator arms (for ease of illustration, only a lowermost one being denoted 38) that extend from the actuator body 36. Distally attached to the actuator arms (the lowermost one being denoted 38) are head gimbal assemblies (the lowermost one denoted 40). The head gimbal assemblies 40 each includes a slider (the lowermost one denoted 42). Each of the sliders 42 includes a transducer head. The head gimbal assemblies 40 with the sliders 42 not attached are referred to as suspension assemblies. It is contemplated that the number of actuator arms and suspension assemblies may vary depending upon the number of disks and disk surfaces utilized.

The actuator body 36 includes a bore, and the actuator 34 further includes a pivot bearing cartridge 44 engaged within the bore for facilitating the actuator body 36 to rotate between limited positions about an axis of rotation 46. The actuator 34 further includes a coil support 48 that extends from one side of the actuator body 36 opposite the actuator arms 38. The coil support 48 is configured to support a coil 50.

A pair of magnetic elements 52, 54 is supported by mounts 56, 58 which are attached to the disk drive base 16 (magnetic element 54 is indicated by the dashed lead line and it is understood the magnetic element 54 is disposed underneath the mount 58). The coil 50 interacts with the magnetic elements 52, 54 to form a voice coil motor for controllably rotating the actuator 34. The head stack assembly 32 further includes a flex circuit assembly 60 and a cable connector 62. The cable connector 62 is attached to the disk drive base 16 and is disposed in electrical communication with the printed circuit board 14. The flex circuit 60 supplies current to the actuator coil 52 and carries signals between the transducer heads 42 and the printed circuit board assembly 14.

Figure 4:
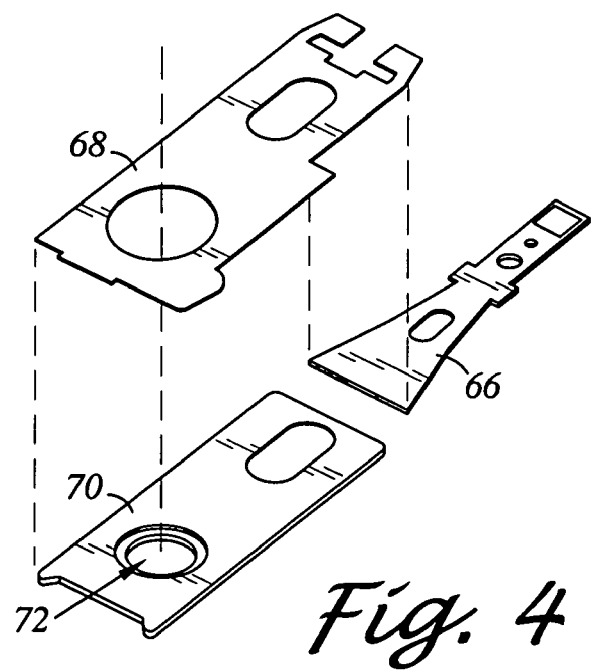
FIG. 4 is an enlarged exploded view of a load beam, a hinge plate, and a swage plate of the head gimbal assembly of FIG. 2.
Figure 5:
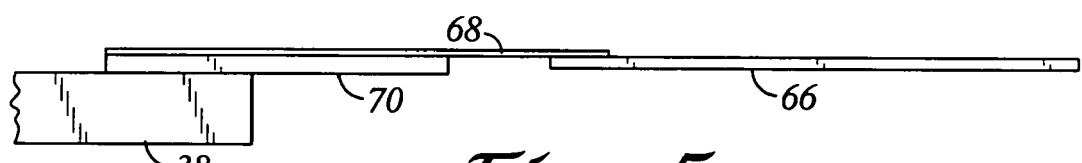
FIG. 5 is a side view of the load beam, the hinge plate, and the swage plate of FIG. 4 as assembled in relation to a portion of an actuator arm of the head stack assembly of FIG. 2.
Figure 6:
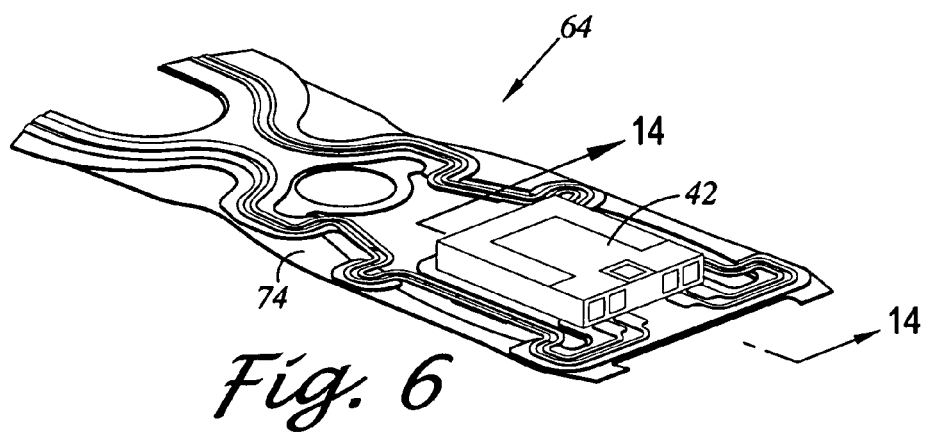
FIG. 6 is an enlarged perspective view of a portion of the trace suspension assembly and slider (shown in phantom lines) of FIG. 3 as seen from another viewing angle.
Figure 7:
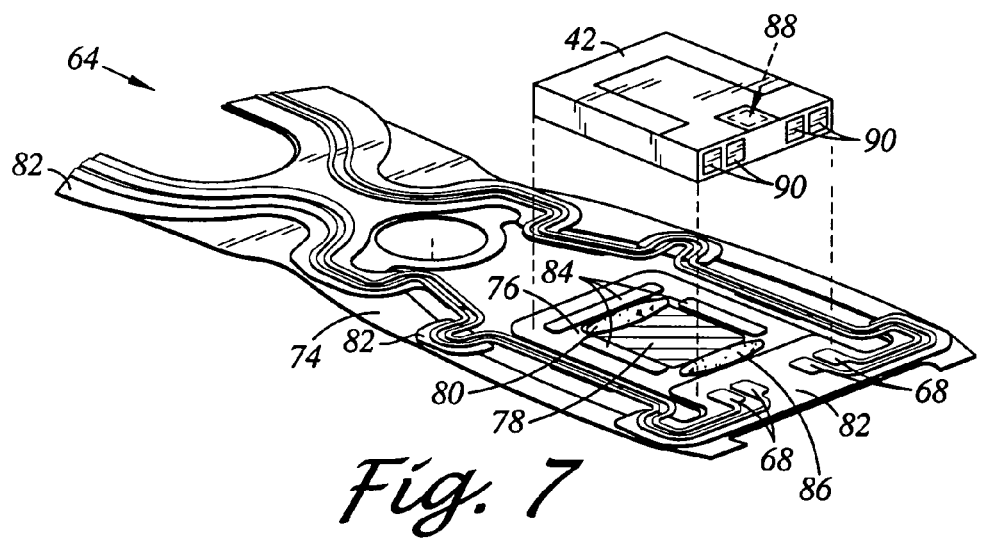
FIG. 7 is an enlarged view of the portion of the trace suspension assembly of FIG. 6 with the slider seen exploded from the trace suspension assembly.

FIG. 2 is an enlarged perspective view of a portion of a head stack assembly 32 of the disk drive 10 of FIG. 1 including the head gimbal assembly 40. Only portions of the two uppermost actuator arms 38 are shown so as to reveal the lowermost actuator arm 38. FIG. 3 is a perspective view of a trace suspension assembly 64 of the head gimbal assembly 40 of FIG. 2 as shown with the slider 42. FIG. 4 is an enlarged exploded view of a load beam 66, a hinge plate 68 and a swage plate 70 of the head gimbal assembly 40 of FIG. 2. FIG. 5 is a side view of the load beam 66, the hinge plate 68, and the swage plate 70 of FIG. 4 as assembled in relation to a portion of an actuator arm 38. The swage plate 70 may include a swage opening 72 which is utilized to attach the swage plate 70 and hinge plate 68 to the actuator arm 38 via a swaging operation. FIG. 6 is an enlarged perspective view of a portion of the trace suspension assembly 64 and slider 42 (shown in phantom lines) of FIG. 3 as seen from another viewing angle. FIG. 7 is an enlarged view of the portion of the trace suspension assembly 64 of FIG. 6 with the slider 42 seen exploded from the trace suspension assembly 64. The trace suspension assembly 64 includes a trace suspension assembly backing layer 74 which includes a gimbal 76. The gimbal 76 is configured to support the slider 42.

Figure 13:
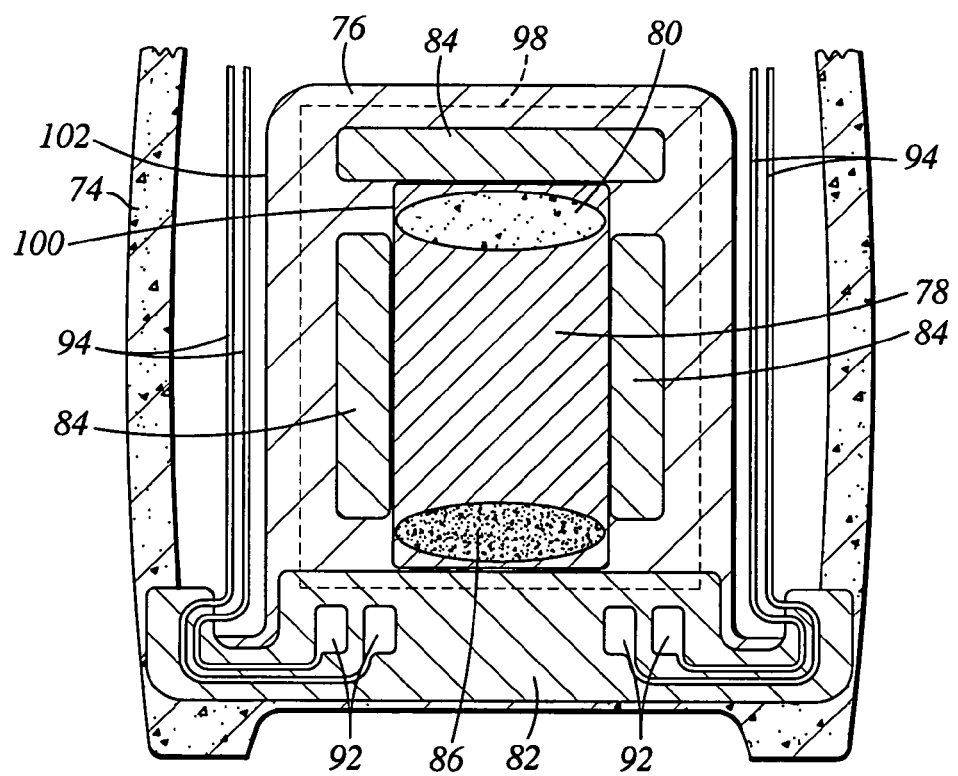
FIG. 13 is the top plan view of the portion of a trace suspension assembly backing layer of FIG. 12 with a conductive compound and an adhesive compound formed upon the gimbal conductive layer.

According to an aspect of the present invention, there is provided the head gimbal assembly 40 for the disk drive 10. The head gimbal assembly 40 includes the trace suspension assembly backing layer 74 including the gimbal 76. Referring additionally to FIG. 13, there is depicted a top plan view of the portion of a trace suspension assembly backing layer 74 that includes the gimbal 76. The trace suspension assembly backing layer 74 is formed of a conductive material having a first oxidation rate. The head gimbal assembly 40 further includes a gimbal conductive layer 78 disposed upon the gimbal 76 and formed of a conductive material having a second oxidation rate lower than the first oxidation rate. The head gimbal assembly 40 further includes the slider 42 supported by the gimbal 76. The head gimbal assembly 40 further includes a conductive compound 80 disposed between the gimbal conductive layer 78 and the slider 42 for electrically grounding the slider 42 to the trace suspension assembly backing layer 74.

It is contemplated that the trace suspension assembly backing layer 74 may be attached to an electrical ground. For example, the trace suspension assembly backing layer 74 may be in electrical communication with other components of the head gimbal assembly 40, such as the load beam 66 or the hinge plate 68. The load beam 66 and the hinge plate 68 are joined with the swage plate 70 which is attached the actuator arm 38. It is contemplated that the actuator arm 38 is in electrical communication with the disk drive base 16 via the pivot bearing cartridge 44 and thus is considered to be an electrical ground.

As mentioned above, the present invention utilizes the gimbal conductive layer 78 disposed upon the gimbal 76. Importantly, the gimbal conductive layer 78 is formed of a conductive material having a second oxidation rate lower than the first oxidation rate of the material of the trace suspension assembly backing layer 74 and therefore the gimbal 76. For example, the gimbal conductive layer 78 may be formed of gold or platinum, and the trace suspension assembly backing layer 74 may be formed of stainless steel. The present invention recognizes that the trace suspension assembly backing layer 74, and thus the gimbal 76, may be susceptible to oxidation. The present invention further recognizes that in the absence of utilization of the gimbal conductive layer 78, the application of the conductive compound 80 directly upon the gimbal 76 may result in an oxidation layer eventually forming or already having been formed upon a surface of the gimbal 76. Such an oxidation layer is contemplated to increase the electrical resistance between the slider 42 and the gimbal 76. As such, the electrical path between the slider 42 and the disk surface 24 may end up having a lower resistance than the electrical path between the slider 42 and the gimbal 76 which is attached to electrical ground. This may result in undesirable electrical discharge events between the slider 42 and the disk 20. Thus, utilization of the gimbal conductive layer 78 formed of the conductive material having a second oxidation rate lower than the first oxidation rate of the material of the trace suspension assembly backing layer 74 mitigates the formation of an oxidation layer at this critical location along the electrical path to ground.

In further detail, according to various embodiments, a dielectric layer 82 may be formed upon the trace suspension assembly backing layer 74 (such as depicted in FIGS. 7 and 13). The dielectric layer 82 may be composed of discrete portions, such as dielectric layer pads 84 disposed upon the gimbal 76. The slider 42 may be supported by the dielectric layer pads 84 An adhesive compound 86, such as a structural epoxy, may be used for secure attachment of the slider 42 to the gimbal 76. The adhesive compound 86 may be disposed between the gimbal conductive layer 78 and the slider 42 as shown. Where minimizing the amount of material utilized for the gimbal conductive layer 78 is of concern, the adhesive compound 86 may be disposed directly between the gimbal 76 and the slider 42. The dielectric layer pads 84 may be used to maintain the slider 42 at a preferred distance from the gimbal 76, and thus may mitigate against the slider 42 squeezing out the adhesive compound 86 and the conductive compound 80 during attachment of the slider 42 to the gimbal 76.

Figure 14:
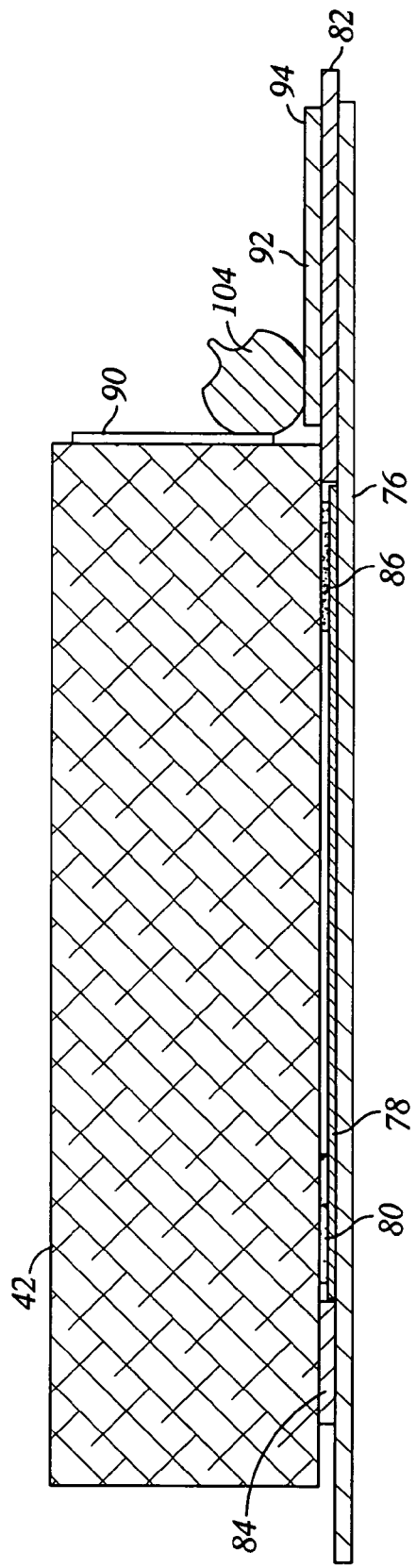
FIG. 14 is a cross-sectional side view of the portion of a trace suspension assembly of FIG. 6 as seen along axis 14—14 as shown with the slider attached and electrically connected to the trace suspension assembly.
Figure 15:
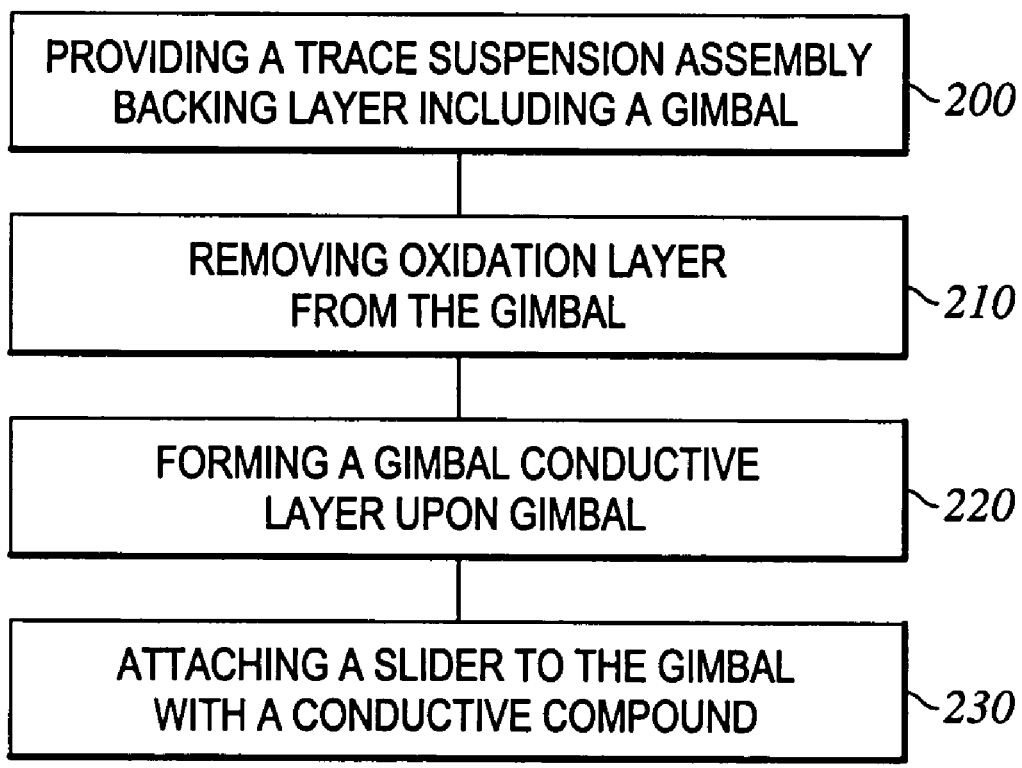
FIG. 15 is a flow diagram of a method of manufacturing a head gimbal assembly according to another aspect of the present invention.

The slider 42 includes a transducer head 88 disposed within the slider 42 (as indicated in dashed line FIG. 7). The slider 42 may include slider conductive pads 90 which internally connect to the transducer head 88 (as shown in FIGS. 7 and 14). Trace conductive pads 92 may be formed upon the dielectric layer 82. The trace conductive pads 92 may extend to electrical traces 94. The slider conductive pads 90 may be electrically connected to trace conductive pads 92 such as through a gold ball bond 104 (as shown in FIG. 14). The trace conductive pads 92 and the electrical traces 94 may be formed of metal such as copper and may be deposited and/or etched upon the dielectric layer 82. The dielectric layer 82 is used to electrically insulate the trace conductive pads 92 and the electrical traces 94 from the trace suspension assembly backing layer 74.

According to another aspect of the present invention, there is provided the head stack assembly 32 for use with a disk drive 10. The head stack assembly 32 includes the flex cable assembly 60, the actuator 34 including the actuator arm 38, and the load beam 66 coupled to the actuator arm 38. The load beam 66 is formed of an electrically conductive material. The head stack assembly 32 further includes a trace suspension assembly backing layer 74 coupled to the load beam 66 and including the gimbal 76. The trace suspension assembly backing layer 74 is formed of a conductive material having a first oxidation rate. The head stack assembly 32 further includes the gimbal conductive layer 78 disposed upon the gimbal and formed of a conductive material having a second oxidation rate lower than the first oxidation rate. The head stack assembly 32 further includes the slider 42 supported by the gimbal 76. The head stack assembly 32 further includes the conductive compound 80 disposed between the gimbal conductive layer 78 and the slider 42 for electrically grounding the slider 42 to the trace suspension assembly backing layer 74.

According to another aspect of the present invention, there is provided a disk drive 10. The disk drive 10 includes a disk drive base 16 and a head stack assembly 32 rotatably coupled to the disk drive base 16. The head stack assembly 32 is as described above.

According to yet another aspect of the present invention, there is provided a method of manufacturing the head gimbal assembly 40 for a disk drive 10. Referring additionally to the flow diagram of FIG. 15, the method includes the step 200 of providing the trace suspension assembly backing layer 74 including the gimbal 76. The trace suspension assembly backing layer 74 is formed of a conductive material having a first oxidation rate. The method further provides a step 220 of forming the gimbal conductive layer 78 upon the gimbal 76. The gimbal conductive layer 78 is formed of a conductive material having a second oxidation rate lower than the first oxidation rate. The method further provides for a step 230 of attaching the slider 42 to the gimbal 76 with the conductive compound 80 disposed between the slider 42 and the gimbal conductive layer 78 for grounding the slider 42 to the trace suspension assembly backing layer 74.

Figure 8:
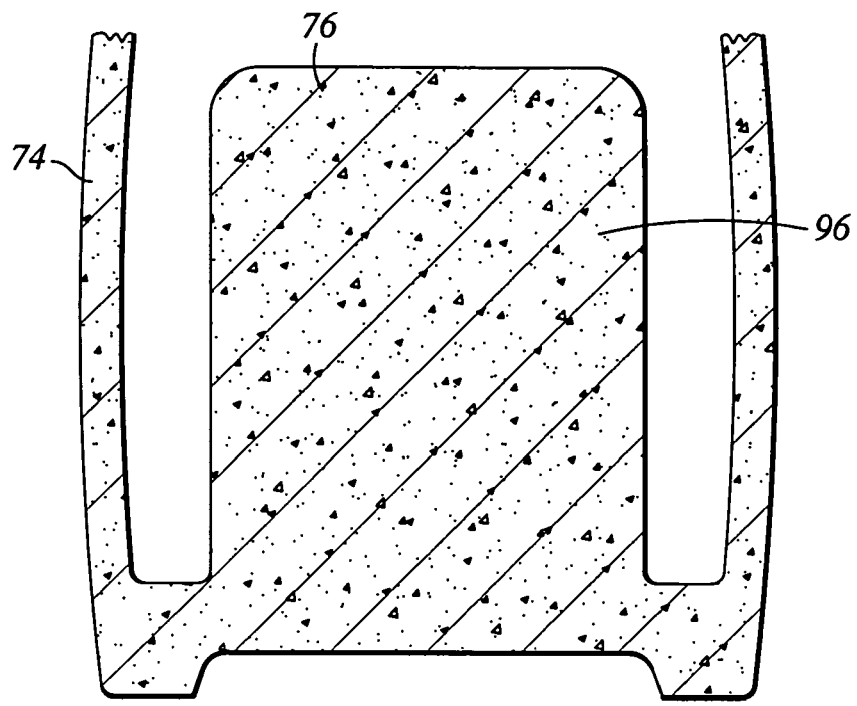
FIG. 8 is a top plan view of a portion of a trace suspension assembly backing layer with a gimbal and including an oxidation layer.
Figure 9:
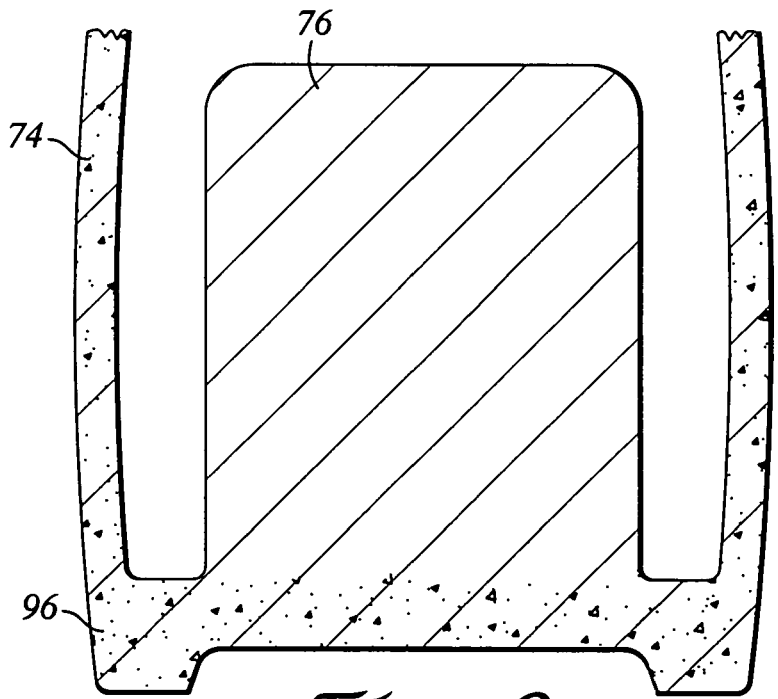
FIG. 9 is the top plan view of the portion of a trace suspension assembly backing layer of FIG. 8 with the oxidation layer removed from the gimbal.
Figure 10:
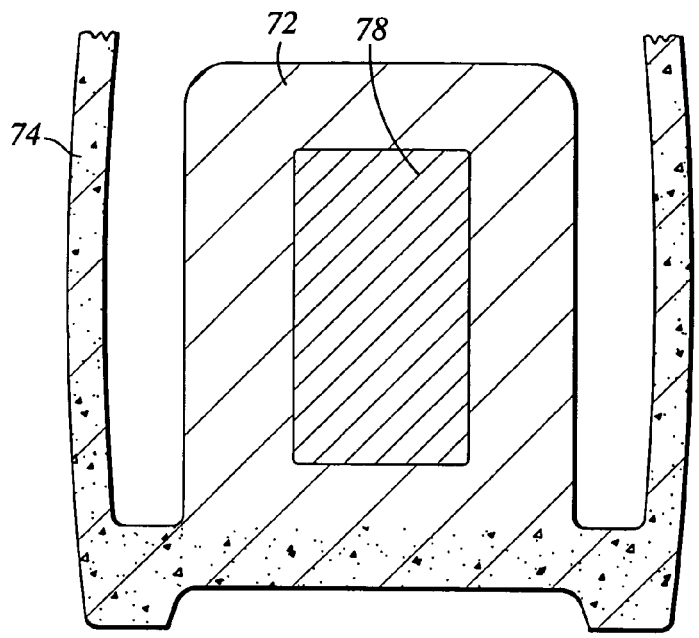
FIG. 10 is the top plan view of the portion of a trace suspension assembly backing layer of FIG. 9 with a gimbal conductive layer formed upon the gimbal.
Figure 11:
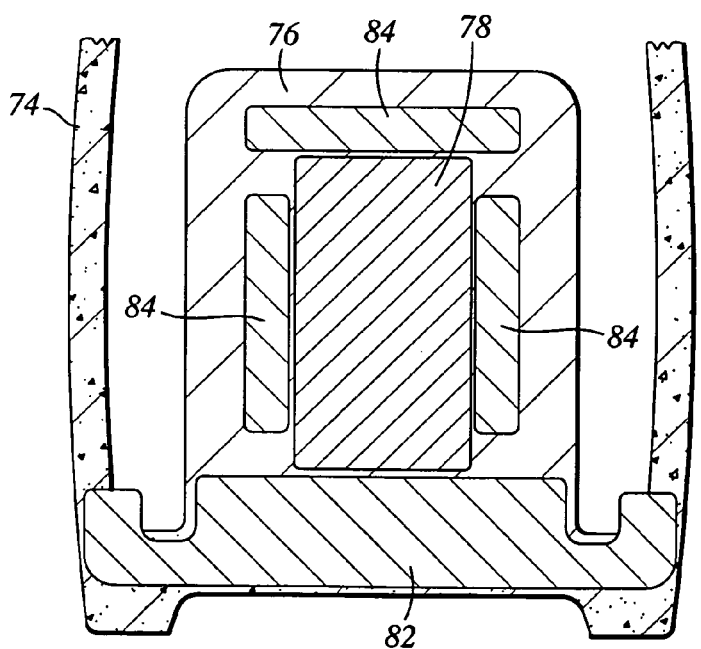
FIG. 11 is the top plan view of the portion of a trace suspension assembly backing layer of FIG. 10 with a dielectric layer formed upon the trace suspension assembly backing layer.
Figure 12:
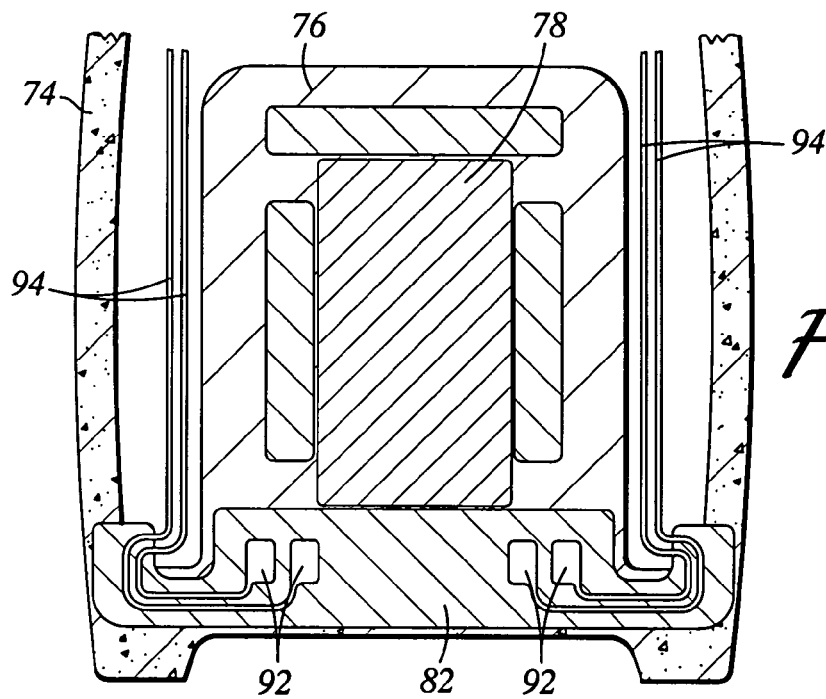
FIG. 12 is the top plan view of the portion of a trace suspension assembly backing layer of FIG. 11 with conductive traces formed upon the dielectric layer.

According to various embodiments and a further illustrated in FIGS. 8–14, as mentioned above, the method initially begins with step 200 of providing the trace suspension assembly backing layer 74 with the gimbal 76 as shown in FIG. 8. The trace suspension assembly backing layer 74 may include an oxidation layer 96 formed upon the surface of the trace suspension assembly backing layer 74. Referring now to FIG. 9, the method may proceed of a step 210 of removing the oxidation layer 96 from the gimbal 76. This may be accomplished such as via an etching process. Next, the method proceeds with the step 220 of forming the gimbal conductive layer 78 upon the gimbal 76. The may be accomplished through a plating process for example. A relatively "clean" electrical connection is established between the gimbal conductive layer 78 and the gimbal 76. Next, as shown in FIG. 11, the dielectric layer 82 including the dielectric layer pads 84 may be formed upon the trace suspension assembly backing layer 74. Subsequently as shown in FIG. 12, the electrical traces 94 and the trace conductive pads 92 may be formed upon the dielectric layer 82.

As next shown in FIG. 13, the step 230 of attaching the slider 42 to the gimbal 76 with the conductive compound 80 disposed between the slider 42 and the gimbal conductive layer 78 for grounding the slider 42 to the trace suspension assembly backing layer 74. The conductive compound 80 may be a conductive epoxy such as a silver conductive epoxy. While the conductive compound 80 is depicted as being applied in a single elongate oval shape, it is understood that the amount and geometry of the conductive compound may differ. Further, multiple portions of the conductive compound 80 may be applied. The slider 42 defines a slider perimeter 98 (the footprint of which is shown in dashed lines) and the gimbal conductive layer 78 defines a gimbal conductive layer perimeter 100 having an area less than an area of the slider perimeter 98. The gimbal defines a gimbal perimeter 102 and the gimbal conductive layer perimeter 100 may have an area less than an area of the gimbal perimeter 102.

We claim:

1. A head gimbal assembly for a disk drive, the head gimbal assembly comprising:
   a trace suspension assembly backing layer including a gimbal, the trace suspension assembly backing layer being formed of a conductive material having a first oxidation rate;
   a gimbal conductive layer disposed upon the gimbal and formed of a conductive material having a second oxidation rate lower than the first oxidation rate;
   a slider supported by the gimbal; and
   a conductive compound disposed between the gimbal conductive layer and the slider for electrically grounding the slider to the trace suspension assembly backing layer.

2. The head gimbal assembly of claim 1 wherein the trace suspension assembly backing layer is formed of stainless steel.

3. The head gimbal assembly of claim 1 wherein the gimbal conductive layer is formed of gold.

4. The head gimbal assembly of claim 1 wherein the gimbal conductive layer is formed of platinum.

5. The head gimbal assembly of claim 1 wherein the slider defines a slider perimeter, the gimbal conductive layer defines a gimbal conductive layer perimeter less than an area of the slider perimeter.

6. The head gimbal assembly of claim 1 wherein the gimbal defines a gimbal perimeter, the gimbal conductive layer defines a gimbal conductive layer perimeter less than an area of the gimbal perimeter.

7. The head gimbal assembly of claim 1 wherein the conductive compound is a conductive epoxy.

8. The head gimbal assembly of claim 1 further includes an adhesive compound disposed between the trace suspension assembly and the slider for attaching the slider to the trace suspension assembly backing layer.

9. The head gimbal assembly of claim 8 wherein the adhesive compound is disposed between the gimbal conductive layer and the slider.

10. The head gimbal assembly of claim 8 wherein the adhesive compound is a structural epoxy.

11. A head stack assembly for use with a disk drive, the head stack assembly comprising:
 a flex cable assembly;
 an actuator including an actuator arm;
 a load beam coupled to the actuator arm, the load beam being formed of an electrically conductive material;
 a trace suspension assembly backing layer being coupled to the load beam and including a gimbal, the trace suspension assembly backing layer being formed of a conductive material having a first oxidation rate;
 a gimbal conductive layer disposed upon the gimbal and formed of a conductive material having a second oxidation rate lower than the first oxidation rate;
 a slider supported by the gimbal; and
 a conductive compound disposed between the gimbal conductive layer and the slider for electrically grounding the slider to the trace suspension assembly backing layer.

12. The head stack assembly of claim 11 wherein the trace suspension assembly backing layer is formed of stainless steel.

13. The head stack assembly of claim 11 wherein the gimbal conductive layer is formed of gold.

14. The head stack assembly of claim 11 wherein the gimbal conductive layer is formed of platinum.

15. The head stack assembly of claim 11 wherein the slider defines a slider perimeter, the gimbal conductive layer defines a gimbal conductive layer perimeter less than an area of the slider perimeter.

16. The head stack assembly of claim 11 wherein the gimbal defines a gimbal perimeter, the gimbal conductive layer defines a gimbal conductive layer perimeter less than an area of the gimbal perimeter.

17. The head gimbal assembly of claim 11 wherein the conductive compound is a conductive epoxy.

18. The head gimbal assembly of claim 17 further includes an adhesive compound disposed between the trace suspension assembly and the slider for attaching the slider to the trace suspension assembly backing layer.

19. The head gimbal assembly of claim 18 wherein the adhesive compound is disposed between the gimbal conductive layer and the slider.

20. The head gimbal assembly of claim 18 wherein the adhesive compound is a structural epoxy.

21. A disk drive comprising:
 a disk drive base; and
 a head stack assembly rotatably coupled to the disk drive base, the head stack assembly including:
  a flex cable assembly;
  an actuator including an actuator arm;
  a load beam coupled to the actuator arm, the load beam being formed of an electrically conductive material;
  a trace suspension assembly backing layer being coupled to the load beam and including a gimbal, the trace suspension assembly backing layer being formed of a conductive material having a first oxidation rate;
  a gimbal conductive layer disposed upon the gimbal and formed of a conductive material having a second oxidation rate lower than the first oxidation rate;
  a slider supported by the gimbal; and
  a conductive compound disposed between the gimbal conductive layer and the slider for electrically grounding the slider to the trace suspension assembly backing layer.

* * * * *